(12) United States Patent
Kuo

(10) Patent No.: US 7,275,587 B2
(45) Date of Patent: Oct. 2, 2007

(54) COMBINATION COOLER MODULE

(76) Inventor: Hua-Shou Kuo, No. 7-2, Lane 20, Jen-Ai St., Tansui, Taipei County (TW)

( * ) Notice: Subject to any disclaimer, the term of this patent is extended or adjusted under 35 U.S.C. 154(b) by 140 days.

(21) Appl. No.: 11/307,057

(22) Filed: Jan. 20, 2006

(65) Prior Publication Data

US 2007/0169918 A1    Jul. 26, 2007

(51) Int. Cl.
*F28D 15/02*    (2006.01)
(52) U.S. Cl. .................... 165/80.3; 165/104.33
(58) Field of Classification Search ........... 165/104.33, 165/80.3, 104.21, 104.26; 361/700; 257/715
See application file for complete search history.

(56) References Cited

U.S. PATENT DOCUMENTS

| 6,860,321 B2 * | 3/2005 | Ji-Hai et al. ................ 165/80.3 |
| 7,036,566 B1 | 5/2006 | Huang |
| 7,130,192 B2 * | 10/2006 | Wang et al. ................ 361/697 |
| 2005/0195569 A1 * | 9/2005 | Hsu ........................... 361/697 |

* cited by examiner

*Primary Examiner*—Teresa J. Walberg
(74) *Attorney, Agent, or Firm*—Pai Petent & Trademark Law Firm; Chao-Chang David Pai

(57) ABSTRACT

A combination cooler module is disclosed, which includes a plurality of radiating fins that are arranged in a stack, a plurality of heat tubes inserted through the radiating fins, and a heat conductive base affixed to the radiating fins by means of a dovetail joint, hook or scarf joint and disposed in contact with the heat tubes.

11 Claims, 9 Drawing Sheets

COMBINATION COOLER MODULE

BACKGROUND OF THE INVENTION (a) Field of the Invention

The present invention relates to a cooler module and more particularly to a combination cooler module in which the base and the radiating fins are fastened together by a dovetail, hook or scarf joint.

(b) Description of the Prior Art

A conventional cooler module is known to comprise a plurality of aluminum or copper radiating fins, a plurality of heat tubes, and a base (copper base). The radiating fins are arranged in parallel. The heat tubes are inserted through the radiating fins to hold the radiating fins in parallel. Further, the heat tubes are soldered to the base by means of the application of a bonding medium, for example, solder paste. If the heat tubes and the base are made of different materials, a nickel-plating treatment is necessary before bonding the heat tubes to the base. This assembly process is complicated, resulting in a high manufacturing cost and low yield. Further, this assembly process will also lower the heat transfer efficiency between the base and the heat tubes.

When using the aforesaid cooler module, a frame holder may be affixed to the radiating fins to hold a cooling fan.

SUMMARY OF THE INVENTION

The present invention has been accomplished under the circumstances in view. According to the present invention, the combination cooler module comprises a plurality of radiating fins arranged in a stack, a plurality of heat tubes inserted through the radiating fins, and a heat conductive base fastened to the radiating fins and disposed in contact with the heat tubes, wherein male coupling means and corresponding female coupling means are provided at the radiating fins and the base for enabling the base to be affixed to the radiating fins by forcing the male coupling means into engagement with the female coupling means.

More precisely, male coupling means may be provided at either the radiating fins or the base, with corresponding female coupling means provided at the base or the radiating fins. Furthermore, both male coupling means and female coupling means may be provided at the radiating fins, with corresponding female coupling means and male coupling means provided at the base. The male coupling means and female coupling means may be arranged symmetrically or asymmetrically.

In one embodiment of the present invention, the male coupling means comprises a plurality of hooked portions downwardly extending from the radiating fins; the female coupling means comprises a plurality of locating grooves formed in the base and respectively forced into engagement with the hooked portions at the radiating fins.

In another embodiment of the present invention, the male coupling means comprises a plurality of protruded portions respectively protruded from the radiating fins and the base; the female coupling means comprises a plurality of locating grooves respectively formed in the radiating fins and the base; the protruded portions of the male coupling means at the radiating fins and the locating grooves of the female coupling means at the radiating fins are respectively forced into engagement with the locating grooves of the female coupling means at the base and the protruded portions of the male coupling means at the base.

In still another embodiment of the present invention, the male coupling means comprises at least one dovetail tongue provided at the radiating fins (or the base); the female coupling means comprises at least one dovetail groove provided at the base (or the radiating fins) and respectively forced into engagement with the at least one dovetail tongue.

In still another embodiment of the present invention, the radiating fins include a plurality of first radiating fins, a plurality of second radiating fins, and a plurality of third radiating fins, the first, second and third radiating fins each having a plurality of upper mounting through holes, the first and third radiating fins each further having a plurality of lower mounting through holes, the second radiating fins each further having a plurality of circularly arched bottom notches; the heat tubes are inserted through the upper mounting through holes and the lower mounting through holes of the radiating fins and attached to the circularly arched bottom notches of the radiating fins.

In still another embodiment of the present invention, the male coupling means comprises two engagement bars, the engagement bars each being formed of a plurality of protruding strips respectively downwardly protruded from the radiating fins at a bottom side; the female coupling means comprises two engagement grooves bilaterally formed in the base and respectively forced into engagement with the protruding strips of the engagement bars.

DETAILED DESCRIPTION OF THE PREFERRED EMBODIMENTS

Figure 1:
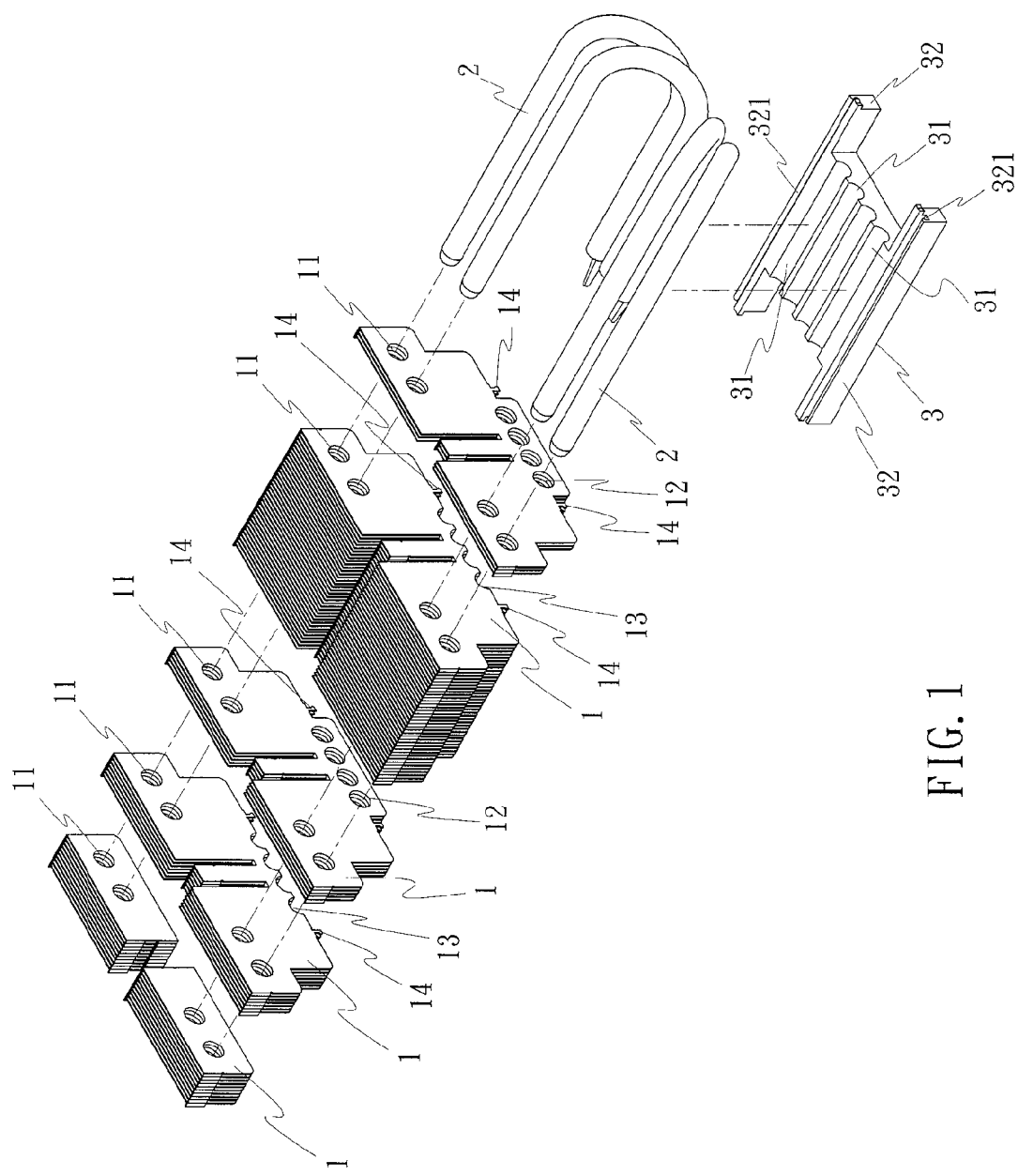
FIG. 1 is an exploded view of a combination cooler module according to a first embodiment of the present invention.
Figure 2:
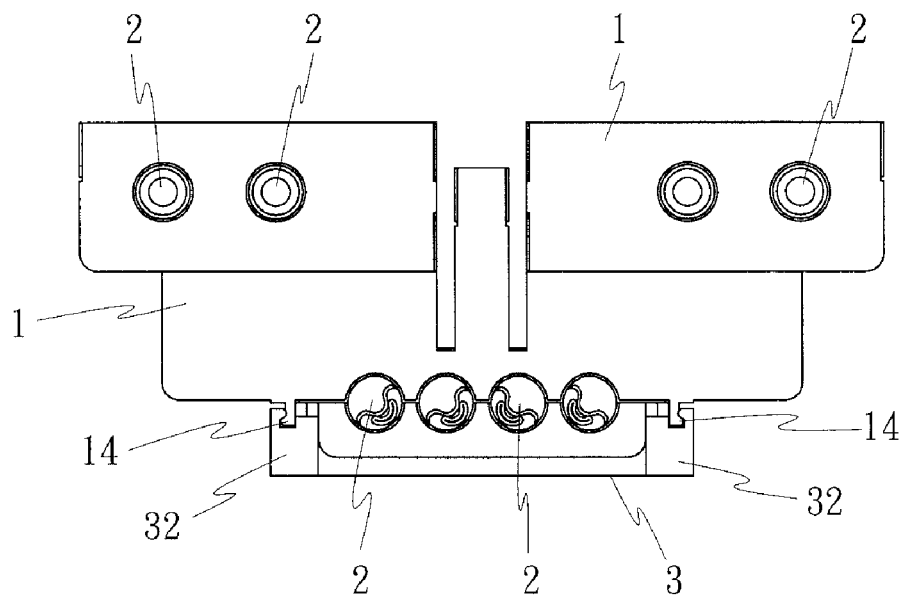
FIG. 2 is a schematic assembly view of the combination cooler module according to the first embodiment of the present invention before fixation.

Referring to FIGS. 1~4, a combination cooler module in accordance with a first embodiment of the present invention comprises a plurality of radiating fins 1, a plurality of heat tubes 2, and a base 3.

The radiating fins 1 are flat metal sheet members arranged in a stack, each having a plurality of upper mounting through holes 11. Some radiating fins 1 further have a plurality of lower mounting through holes 12 and two bottom hooked portions 14. Further, some radiating fins 1 that have bottom hooked portions 14 have a series of circularly arched bottom notches 13 arranged between the respective bottom hooked portions 14.

The heat tubes 2 are metal U-tubes, each having the two distal ends closed and a working fluid filled therein. The heat tubes 2 are respectively inserted through the upper mounting through holes 11 and lower mounting through holes 12 of the radiating fins 1.

The base 3 is a plate member made out of copper, aluminum, or any of a variety of heat conductive materials, having two vertical sidewalls 32, two locating grooves 321 respectively formed in the top side of the vertical sidewalls 32 and extending along the length of the vertical sidewalls 32, and a plurality of positioning grooves 31 formed in the top surface and extending to the front and rear sides. The positioning grooves 31 have a circularly arched cross section. The two vertical sidewalls 32 have the front and rear sides respectively protruded over the front and rear sides of the positioning grooves 31, therefore the base 3 shows an H-shaped cross section.

Figure 3:
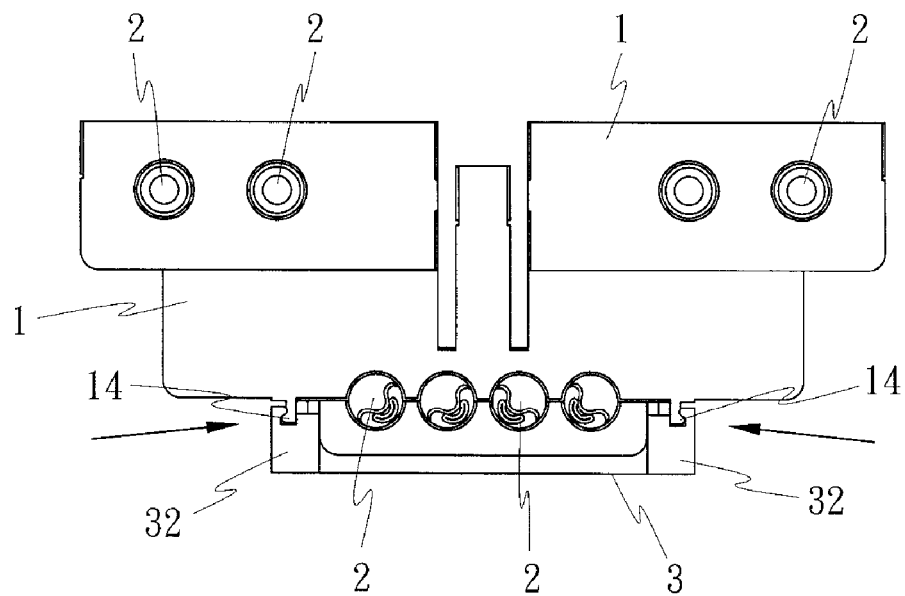
FIG. 3 is a schematic assembly view of the combination cooler module according to the first embodiment of the present invention after fixation.
Figure 4:
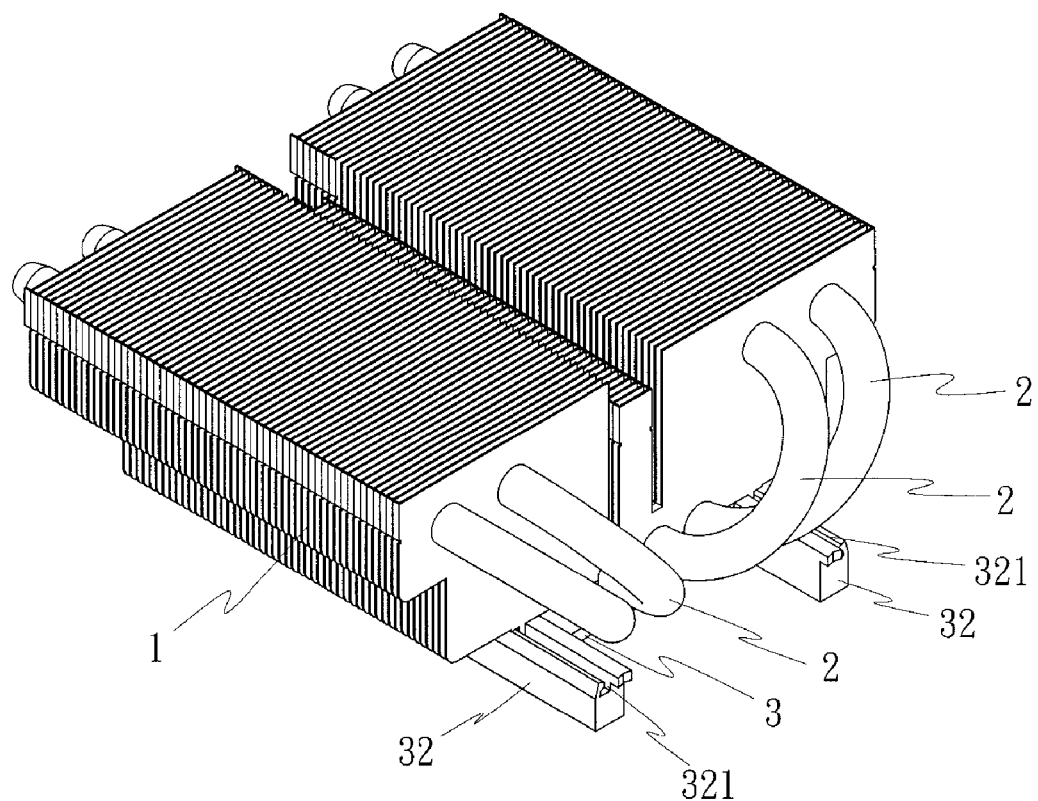
FIG. 4 is an perspective view of the combination cooler module according to the first embodiment of the present invention.

During assembly process, the heat tubes 2 are inserted with the respective two distal ends through the upper mounting through holes 11 and lower mounting through holes 12 and peripherally attached to the circularly arched bottom notches 13 to join the radiating fins 1, and then the base 3 is attached to the heat tubes 2 and the radiating fins 1 to force the positioning grooves 31 toward the heat tubes 2, and then a pressure is applied to the base 3 against the heat tubes 2 and the radiating fins 1 to force the positioning grooves 31 of the base 3 into engagement with the periphery of the heat tubes 2 and to simultaneously force the locating grooves 321 of the base 3 into engagement with the bottom hooked portions 14 of the radiating fins 1 (see FIG. 3).

Figure 5:
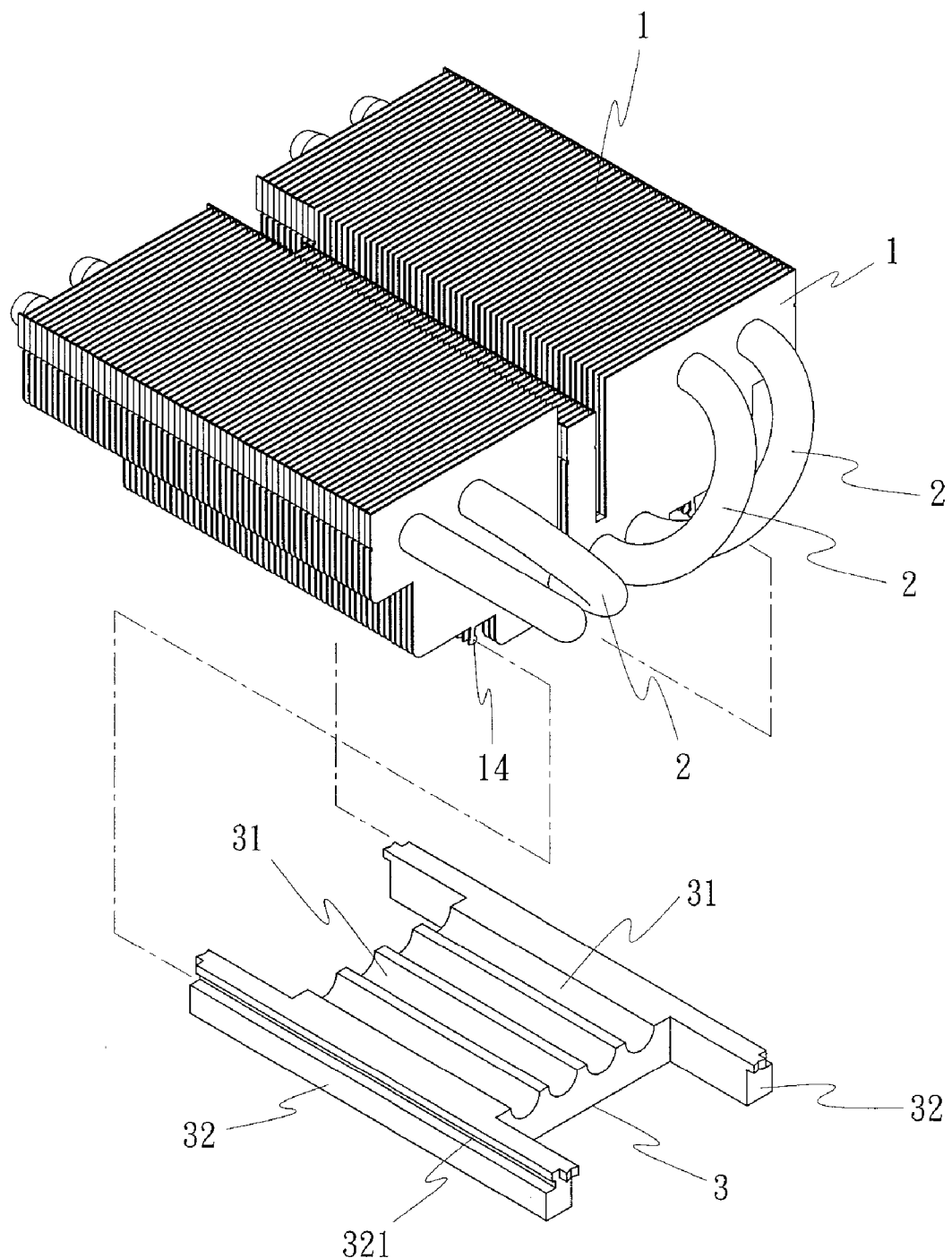
FIG. 5 is an exploded view of a combination cooler module according to a second embodiment of the present invention.
Figure 6:
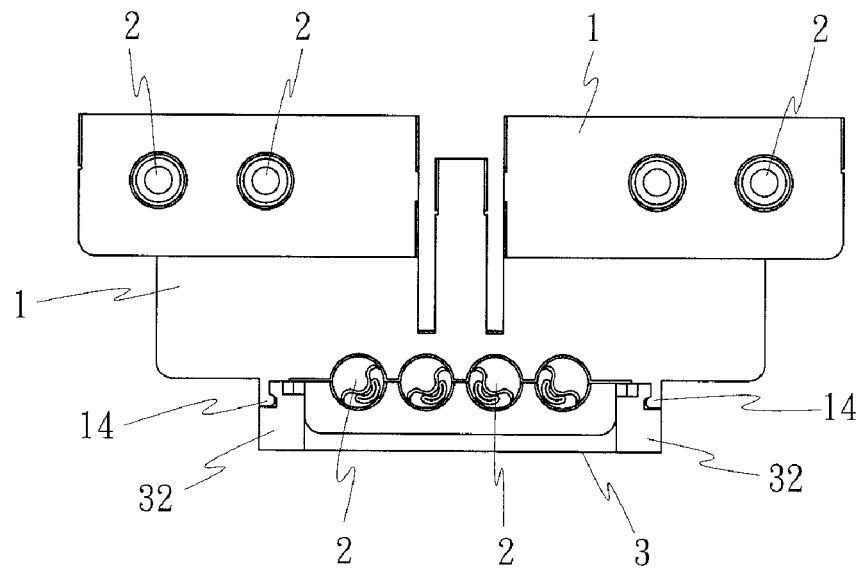
FIG. 6 is a schematic assembly view of the combination cooler module according to the second embodiment of the present invention.

FIGS. 5 and 6 show a combination cooler module in accordance with a second embodiment of the present invention. This embodiment is substantially similar to the aforesaid first embodiment with the exception of the location of the locating grooves 321 at the vertical sidewalls 32 of the base 3. This embodiment is assembled in the same manner as the aforesaid first embodiment.

Figure 7:
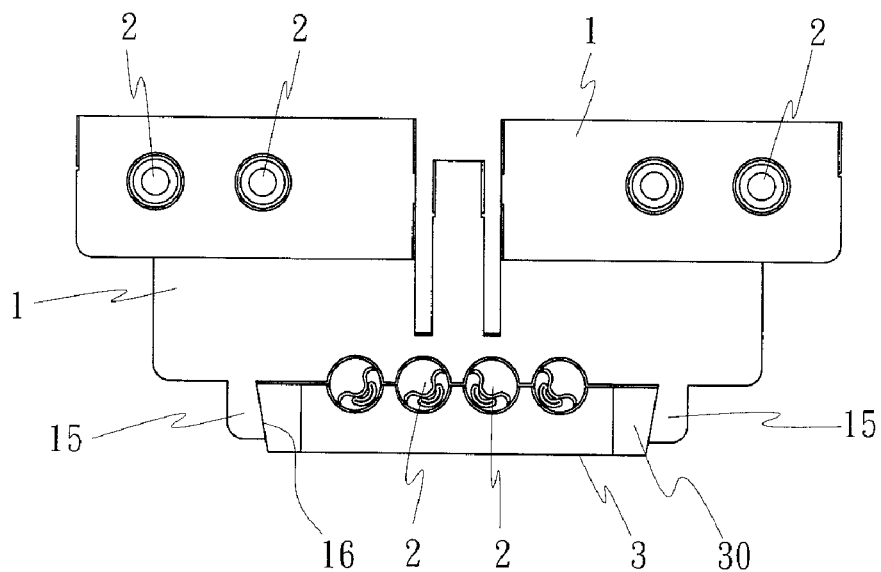
FIG. 7 is a schematic assembly view of a combination cooler module according to a third embodiment of the present invention.
Figure 8:
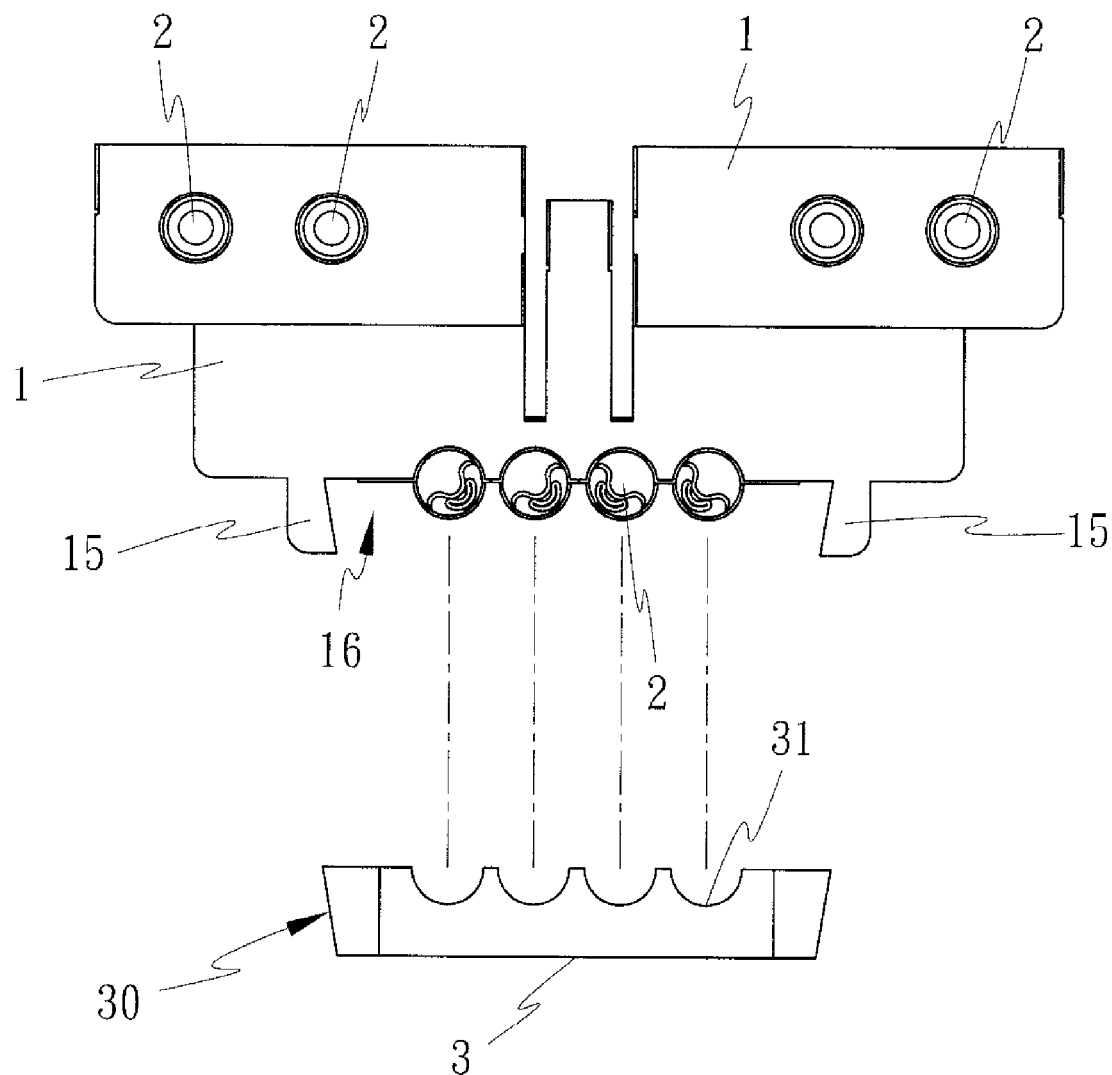
FIG. 8 is an exploded view of FIG. 7.

FIGS. 7 and 8 show a combination cooler module in accordance with a third embodiment of the present invention. According to this embodiment, the radiating fins 1 each have two bottom protrusions 15 that define with the bottom edge of the respective radiating fin a dovetail groove, and the base 3 has a corresponding dovetailed cross section that is forced into engagement with the dovetail groove between the two bottom protrusions 15 of each radiating fin 1.

Figure 9:
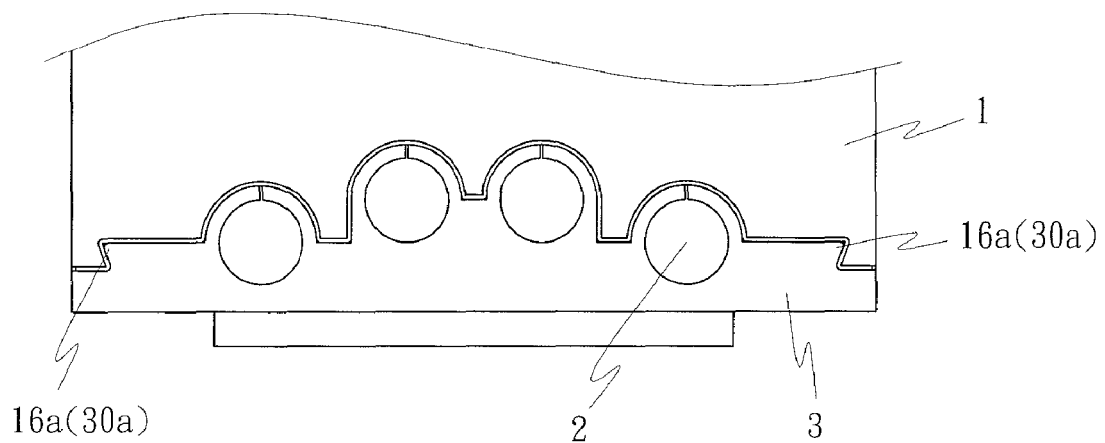
FIG. 9 is a schematic assembly view of a part of a combination cooler module according to a fourth embodiment of the present invention.

FIG. 9 is a schematic assembly view of a part of a combination cooler module according to a fourth embodiment of the present invention. According to this embodiment, the base 3 has an upper part forming a dovetail tongue 30a that is forced into engagement with a corresponding dovetail groove 16a at the bottom side of the radiating fins 1.

Figure 10:
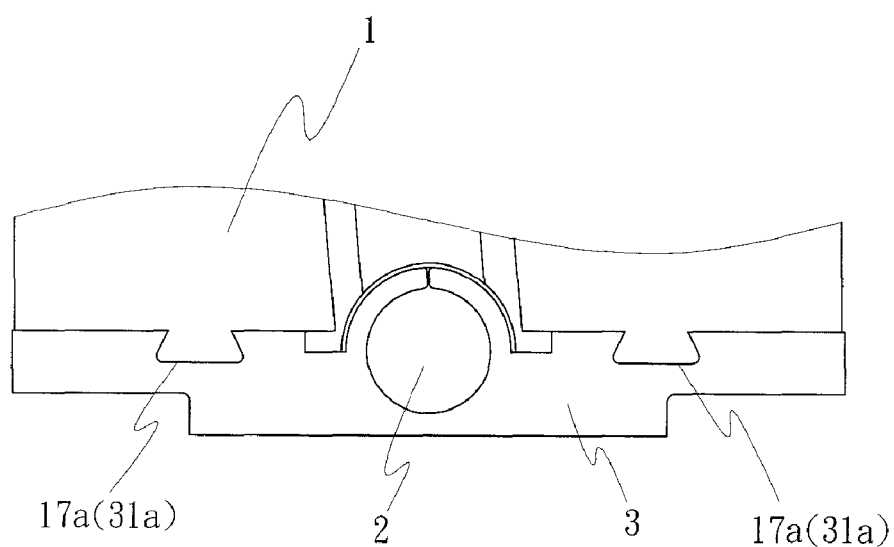
FIG. 10 is a schematic assembly view of a part of a combination cooler module according to a fifth embodiment of the present invention.
Figure 11:
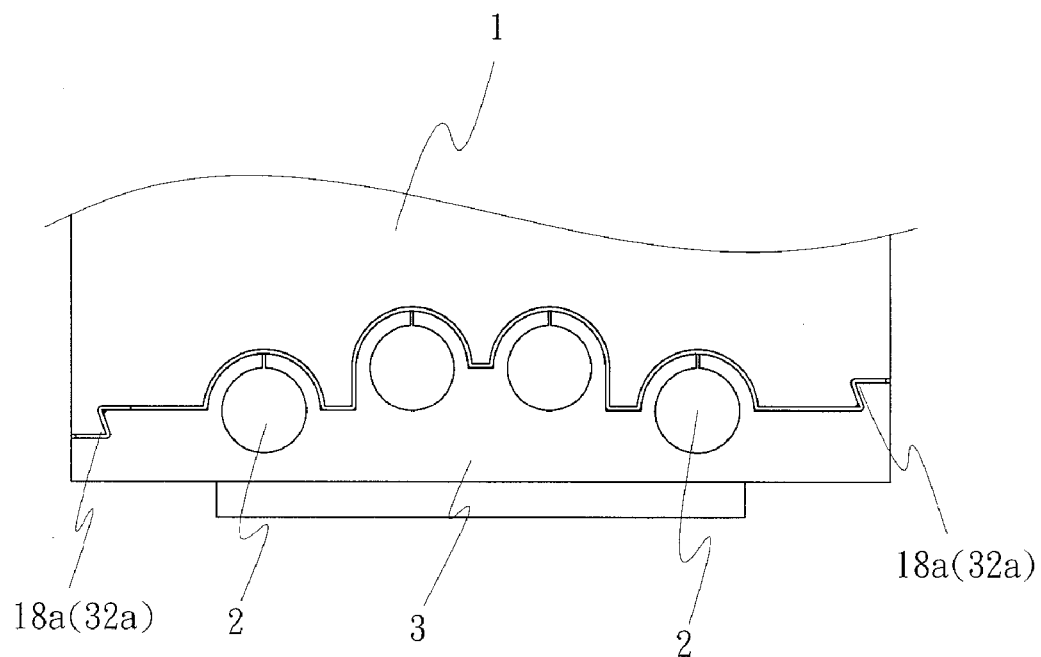
FIG. 11 is a schematic assembly view of a part of a combination cooler module according to a sixth embodiment of the present invention.

FIG. 10 is a schematic assembly view of a part of a combination cooler module according to a fifth embodiment of the present invention. According to this embodiment, the radiating fins 1 each have two bottom dovetail tongues 17a respectively forced into engagement with a corresponding dovetail groove 31a at the base 3.

FIG. 111 is a schematic assembly view of a part of a combination cooler module according to a sixth embodiment of the present invention. According to this embodiment, the radiating fins 1 and the base 3 are fastened together by means of a scarf joint 18a/32a.

Figure 12:
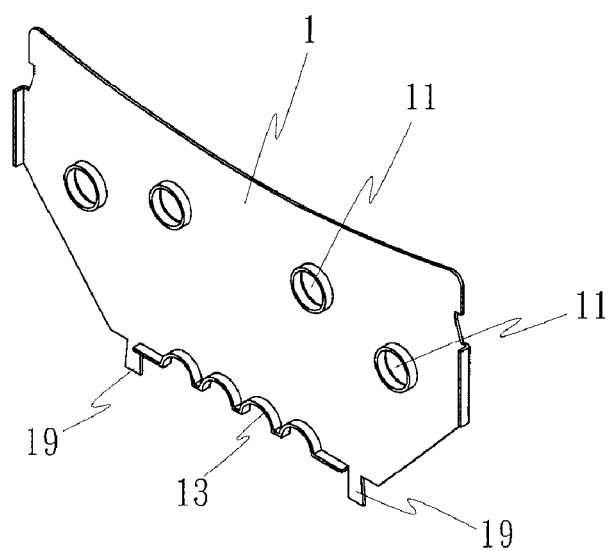
FIG. 12 is a perspective view of a radiating fin for a combination cooler module according to a seventh embodiment of the present invention.
Figure 13:
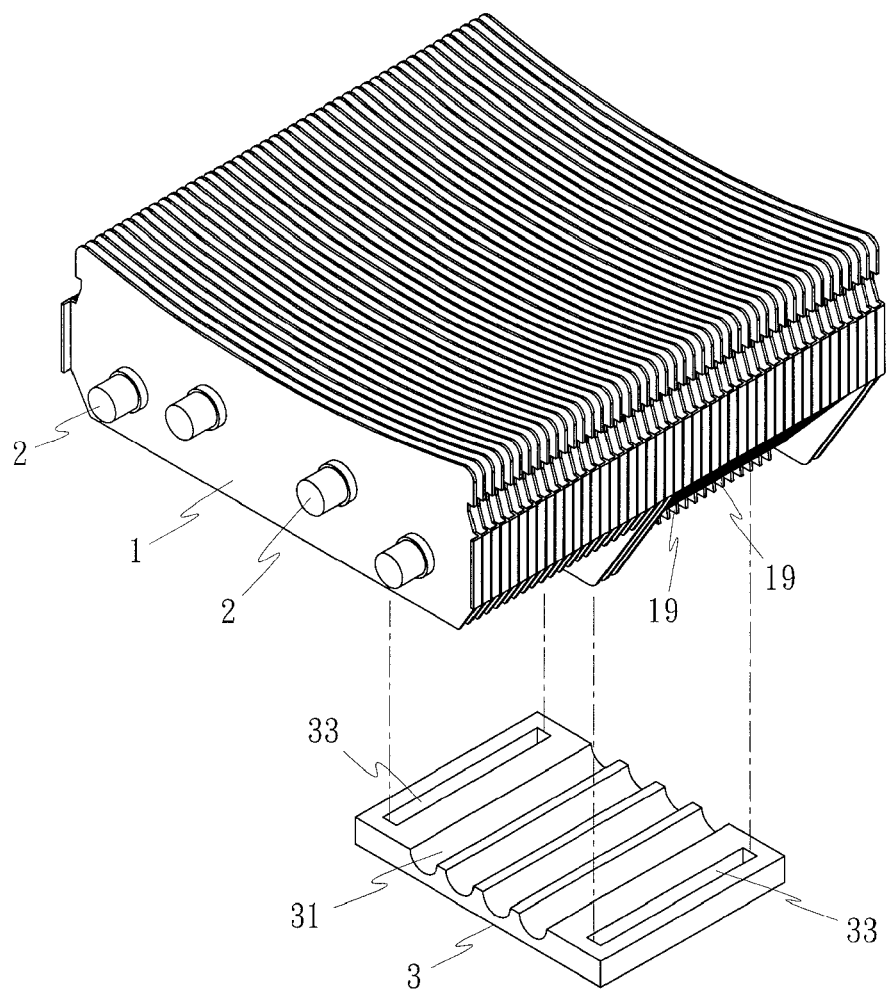
FIG. 13 is an exploded view of the combination cooler module according to the seventh embodiment of the present invention.
Figure 14:
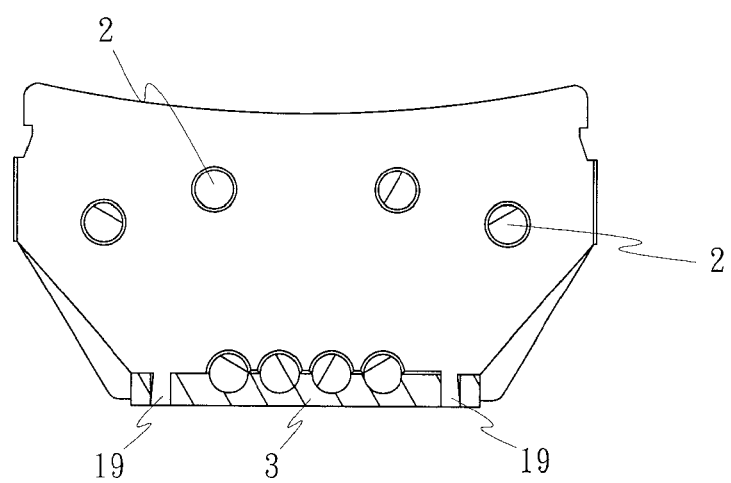
FIG. 14 is a schematic end view showing the combination cooler module of the seventh embodiment of the present invention assembled.

FIGS. 12~14 show a combination cooler module in accordance with a seventh embodiment of the present invention assembled. According to this embodiment, the radiating fins 1 each have two bottom protruding strips 19; the base 3 has two engagement grooves 33 formed in the top surface and arranged in parallel at two sides of the positioning grooves 31. When the radiating fins 1 are arranged in a stack, the bottom protruding strips 19 of the radiating fins 1 form two engagement bars that are forced into engagement with the engagement grooves 33 of the base 3.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A combination cooler module comprising a plurality of radiating fins arranged in a stack, a plurality of heat tubes inserted through said radiating fins, and a heat conductive base fastened to said radiating fins and disposed in contact with said heat tubes, wherein male coupling means and corresponding female coupling means are provided at said radiating fins and said base for enabling said base to be affixed to said radiating fins by forcing said male coupling means into engagement with said female coupling means.

2. The combination cooler module as claimed in claim 1, wherein said male coupling means comprises a plurality of hooked portions downwardly extending from said radiating fins; and said female coupling means comprises a plurality of locating grooves formed in said base and respectively forced into engagement with said hooked portions.

3. The combination cooler module as claimed in claim 2, wherein said base comprises two vertical sidewalls, and said locating grooves are respectively formed in said vertical sidewalls of said base.

4. The combination cooler module as claimed in claim 2, wherein said base has an H-shaped cross section.

5. The combination cooler module as claimed in claim 2, wherein said hooked portions at said radiating fins are respectively forced into engagement with said locating grooves at said base by stamping.

6. The combination cooler module as claimed in claim 1, wherein said male coupling means comprises a plurality of protruded portions respectively symmetrically protruded from said radiating fins and said base; said female coupling means comprises a plurality of locating grooves respectively symmetrically formed in said radiating fins and said base; and the protruded portions of said male coupling means at said radiating fins and the locating grooves of said female coupling means at said radiating fins are respectively forced into engagement with the locating grooves of said female coupling means at said base and the protruded portions of said male coupling means at said base.

7. The combination cooler module as claimed in claim 1, wherein said male coupling means comprises a plurality of protruded portions respectively asymmetrically protruded from said radiating fins and said base; said female coupling means comprises a plurality of locating grooves respectively asymmetrically formed in said radiating fins and said base; and the protruded portions of said male coupling means at said radiating fins and the locating grooves of said female coupling means at said radiating fins are respectively forced into engagement with the locating grooves of said female coupling means at said base and the protruded portions of said male coupling means at said base.

8. The combination cooler module as claimed in claim 1, wherein said male coupling means is deformed by a pressure and forced into engagement with said female coupling means.

9. The combination cooler module as claimed in claim 1, wherein said male coupling means comprises at least one dovetail tongue; said female coupling means comprises at least one dovetail groove respectively forced into engagement with said at least one dovetail tongue.

10. The combination cooler module as claimed in claim 1, wherein said radiating fins include a plurality of first radiating fins, a plurality of second radiating fins, and a plurality of third radiating fins, said first, second and third radiating fins each having a plurality of upper mounting through holes, said first and third radiating fins each further having a plurality of lower mounting through holes, said second radiating fins each further having a plurality of circularly arched bottom notches; said heat tubes are inserted through said upper mounting through holes and said lower mounting through holes of said radiating fins and attached to said circularly arched bottom notches of said radiating fins.

11. The combination cooler module as claimed in claim 1, wherein said male coupling means comprises two engagement bars, the engagement bars each being formed of a plurality of protruding strips respectively downwardly protruded from said radiating fins at a bottom side; said female coupling means comprises two engagement grooves bilaterally formed in said base and respectively forced into engagement with said protruding strips of said engagement bars.

* * * * *